(12) United States Patent
Houtman (10) Patent No.: US 7,136,445 B2
(45) Date of Patent: Nov. 14, 2006

(54) PHASE TRACKER FOR LINEARLY MODULATED SIGNAL

(75) Inventor: Tom Houtman, Ottawa (CA)

(73) Assignee: Transcore Link Logistics Corporation (CA)

( * ) Notice: Subject to any disclaimer, the term of this patent is extended or adjusted under 35 U.S.C. 154(b) by 776 days.

(21) Appl. No.: 10/198,193

(22) Filed: Jul. 19, 2002

(65) Prior Publication Data

US 2003/0016767 A1 Jan. 23, 2003

Related U.S. Application Data

(60) Provisional application No. 60/306,165, filed on Jul. 19, 2001.

(51) Int. Cl.
*H03D 3/24* (2006.01)
(52) U.S. Cl. .................................................. 375/375
(58) Field of Classification Search ............... 375/326, 375/145, 324, 148, 371, 373, 376, 354, 375; 327/141, 144–146
See application file for complete search history.

(56) References Cited

U.S. PATENT DOCUMENTS

| | | | |
|---|---|---|---|
| 4,937,841 A | 6/1990 | Sollenberger et al. | |
| 5,497,400 A * | 3/1996 | Carson et al. | 375/324 |
| 5,960,044 A | 9/1999 | Montreuil | |
| 6,147,561 A * | 11/2000 | Rhee et al. | 331/12 |
| 6,185,244 B1 * | 2/2001 | Nystrom et al. | 375/145 |
| 6,570,910 B1 * | 5/2003 | Bottomley et al. | 375/148 |
| 6,775,322 B1 * | 8/2004 | Zangi et al. | 375/232 |
| 2002/0064240 A1 * | 5/2002 | Joshi et al. | 375/326 |
| 2002/0064244 A1 | 5/2002 | Berggren et al. | |
| 2002/0158622 A1 * | 10/2002 | Rayne et al. | 324/76.53 |

FOREIGN PATENT DOCUMENTS

JP 08172460 * 7/1996

OTHER PUBLICATIONS

Kam et al. "Optimum Symbol-By-Symbol Detection of Uncoded Digital Data Over the Gaussian Channel with Unknown Carrier Phase." IEEE Transactions on Communications, IEEE Inc. New York, U.S. vol. 42, No. 8, Aug. 1, 1994. Pages 2543-2552, XP000462370, ISSN: 0090-6778.

* cited by examiner

*Primary Examiner*—Tesfaldet Bocure
(74) *Attorney, Agent, or Firm*—Blank Rome LLP (57) ABSTRACT

A method is disclosed for tracking the phase of a received phase-modulated carrier carrying a sequence of symbols represented by phase jumps in a low signal-to-noise ratio environment. An input sequence of symbols stored in a delay line. The phase of a current symbol in a phase locked loop, and the phase error detected in the phase locked loop is updated to take into account phase error estimates of future symbols.

33 Claims, 5 Drawing Sheets

PHASE TRACKER FOR LINEARLY MODULATED SIGNAL

CROSS REFERENCE TO RELATED APPLICATIONS

This application claims the benefit under 35 USC 119(2) of U.S. Provisional Application No. 60/306,165 filed Jul. 19, 2001, incorporated by reference herein.

BACKGROUND OF THE INVENTION

1. Field of the Invention

This invention relates to the field of digital communications, and in particular to a method and apparatus for tracking the phase of a received linearly-modulated signal.

2. Description of Related Art

In a typical digital communications system, digital modulation techniques, such as phase modulation techniques, are used to transmit data using an analog waveform. This waveform is typically an RF carrier, but such techniques are also used in wireline systems.

The data is usually modulated onto the carrier using a digital phase modulation. A simple form of digital phase modulation is phase-shift keying (PSK). This involves changing the phase of the transmitted waveform. These finite phase changes represent digital data. In its simplest form, a phase-modulated waveform can be generated by using the digital data to switch between two signals of equal frequency but opposing phase. If the resultant waveform is multiplied by a sine wave of equal frequency, two components are generated: one cosine waveform of double the received frequency and one frequency-independent term whose amplitude is proportional to the cosine of the phase shift. Filtering out the higher-frequency term yields the original modulating data prior to transmission.

Quadrature phase-Shift Keying (QPSK) takes the concept of PSK a stage further. The number of phase shifts is not limited to only two states. With QPSK, the carrier undergoes four changes in phase and can thus represent a group of 2 binary bits of data, known as a symbol. The phase shift on a carrier can be demodulated into a varying output voltage by multiplying the carrier with a sine-wave local oscillator and filtering out the high-frequency term. Unfortunately, the phase shift is limited to two quadrants; a phase shift of $\pi/2$ cannot be distinguished from a phase shift of $-\pi/2$. Therefore, to accurately decode phase shifts present in all four quadrants, the input signal needs to be multiplied by both sinusoidal and cosinusoidal waveforms, the high frequency filtered out, and the data reconstructed. In Offset Quadraphase Phase Shift Keying (OQPSK), the I or P components of the signal are delayed by half a symbol period.

Forward error correcting (FEC) techniques are used to include redundancy in the transmitted data, and this redundancy enables the original data to be recovered at the receiver in the event of noise, typically at low signal-to-noise ratios. There is a trade-off between the amount of redundancy included in the transmitted signal and the transmission rate or signal-to-noise ratio.

Modern parallel-concatenated (turbo codes) used for forward error correction allow for efficient operation at very low signal-to-noise ratios. A turbo encoder consists of a combination of two simple encoders. The input is a block of k information bits. The two encoders generate parity symbols from two simple recursive convolutional codes, each with a small number of states. An interleaver permutes the original k information bits before input to the second encoder. The permutation P allows that input sequences for which one encoder produces low-weight codewords will cause the other encoder to produce high-weight codewords. Thus, even though the constituent codes are individually weak, the combination is very powerful.

Wireless and passband wireline digital communications receivers typically incorporate timing, frequency and phase tracking functions which are followed by forward error correction (FEC) decoding in order to recover the original data. These functions are accomplished using digital signal processing techniques in most current receivers.

At the receiver, timing, frequency and phase estimation tasks must be performed in order to recover the original data. These tasks may be carried out either serially or jointly, with simultaneous estimation of multiple parameters. A number of phase tracking techniques have been developed for linearly modulated passband communications. See, for example, Mengali, U. and D'Andrea, A. N., Synchronization Techniques for Digital Receivers, Plenum Press, New York, 1997; and Meyr, H., Moeneclaey, M., Fechtel, S. A, Digital Communications Receivers: Synchronization, Channel Estimation, and Signal Processing, John Wiley & Sons, Inc., New York, 1998, the contents of which are herein incorporated by reference. These techniques can generally be divided into two classes: feedback and feedforward phase estimators.

A feedback phase estimator typically performs per-symbol processing in an iterative manner: for each symbol, the previous symbol phase estimate is used to extract a phase error value, which is then low-pass filtered. The low-pass filter output is used to update the previous symbol phase estimate. For phase recovery of linearly modulated signals, the phase error recovery process is designed to minimize the effect of signal modulation on the phase error estimate. Two common approaches are the use of decision-directed or maximum likelihood phase error detectors.

Feedforward phase estimators perform modulation-dependent mathematical operations on the symbols to remove the effect of modulation without the use of a current phase estimate. The output quantities of this process are smoothed, following which a feedback phase unwrapping operation is performed (if required). Finally, the phase estimates are extracted from the smoothed, unwrapped quantities. For example, with quadrature phase shift keying (QPSK) modulated signals, the complex baseband symbols can be raised to the fourth power to remove the effect of modulation. The fourth-power quantities are smoothed and phase-angle is extracted, following which a phase unwrapping process is applied. The phase estimates can then be formed as ¼ of the unwrapped phase angles.

The error rate performance of a typical digital communications system is usually constrained by the performance of the forward error correction code; other demodulator functions such as phase tracking/estimation introduce relatively small losses from the error rate which can be provided by the FEC code at a given signal-to-noise ratio (SNR) on an additive white Gaussian noise channel.

Advances in forward error correction coding such as parallel-concatenated (turbo) and serial-concatenated convolutional codes and low density parity check codes, along with iterative decoding techniques, have enabled communications with greater power efficiency than previously attainable. With the lowered minimum operating SNR this implies, the phase tracking component of the demodulator must also be capable of improved performance. Otherwise, the phase tracker can become the limiting factor for the link error rate performance, and the benefit of the FEC codes' improved performance cannot be achieved.

SUMMARY OF THE INVENTION

The present invention is an improvement of standard phase tracking methods which achieves improved phase jitter and phase slip rate performance under high phase noise or mobile channel conditions.

According to the present invention there is provided a method of tracking the phase of a received linearly-modulated carrier carrying a sequence of symbols, comprising storing an input sequence of said symbols in a delay line; detecting the phase error of a current symbol in a phase locked loop; and updating the phase error detected in said phase locked loop to take into account detected phase errors of future symbols relative to said current symbol.

The invention is applicable to any linearly modulated carrier, such as a phase modulated carrier, an amplitude shift modulated carrier, or an quadrature amplitude modulated carrier. A particular suitable example is OQPSK (Offset Quadrature Phase Shift Keying).

The detected phase errors are preferably based on the phase estimate of the symbol preceding the current symbol. This can be converted to a complex representation and multiplied by input signals from the delay line for input to the phase error detectors.

The phase error detectors are preferably maximum likelihood phase error detectors, although other types of phase error detector can be employed.

A novel aspect of the invention is that it takes into account the computed phase errors of "future" symbols. Since obviously, the invention cannot look into the future, in practice this means that a sequence of N+1 symbols are stored in a delay line, and the "current symbol" being processed is always several symbols behind the symbol actually being input to the phase tracker at any point in time. By basing the phase estimate of the current symbol in part on the phase errors of the next N future symbols, improved accuracy can be achieved at very low signal-to-noise ratios.

In a preferred aspect of the invention, the phase estimate calculated at the last symbol is used to determine the phase error at the next N symbols. The output of a low-pass filter output in a phase-locked loop is updated using the current symbol phase error. Then an update quantity is formed as the sum of the low-pass filter output multiplied by a gain constant and the weighted sum of the computed next N phase errors.

More specifically, in a preferred embodiment of the invention, the modulation is OQPSK (Offset Quadrature Phase Shift Keying). In this case, the method of the invention involves the following steps:

1. correct the phase of N+1 current and future symbols using the current phase estimate;
2. calculate N+1 current and future phase error errors as $$u(k)=Re(x(k))Im(x(k))-Re(x(n+\tfrac{1}{2}))Im(x(n+\tfrac{1}{2})),$$

where x(n) is the symbol sequence, n is the symbol index, and time instants n and n+½ are synchronized with the I and Q transmissions, respectively (Re( ) and IM( ) represent the real and imaginary parts of the phase estimates);
3. feed the current phase error into a filter;
4. calculate a smoothed phase error estimate as the weighted sum of the filter output and the N future estimates;
5. multiply the error estimate by a gain and add it to the current phase to get the next phase; and 6. if the last N symbols in the packet have not yet been reached, continue with the next symbol. If the $N^{th}$ future symbol is the last in the packet, switch to a traditional phase tracker. For this phase tracker, use the same filter with the initial state vector unchanged. This is equivalent to setting the weights for the N future estimates to zero.

In another aspect the invention provides an apparatus for of tracking the phase of a received linearly-modulated carrier carrying a sequence of symbols, comprising a delay line having a plurality of delay elements for storing an input sequence of said symbols; a phase locked loop including a phase error detector for detecting the phase error of a current symbol; an arrangement of additional phase error detectors for detecting the phase errors of the next N symbols relative to said current symbol; and an updater for updating the phase error detected in said phase locked loop to take into account detected phase errors of said next N symbols.

The updater preferably comprises an adder to which the weighted sum of the additional phase error detectors is added.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
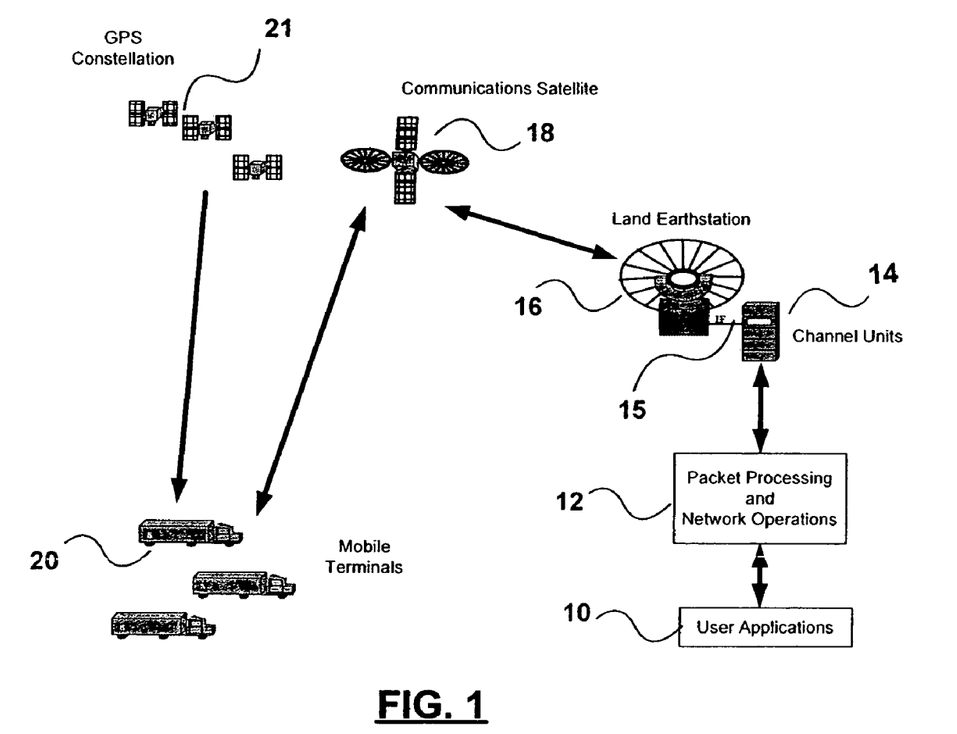
FIG. 1 is a block diagram of a satellite digital communications system.

The satellite digital communications system shown in FIG. 1 is a typical application for the present invention. It could be, for example, the Globalwave™ asset tracking system. User applications 10 communicate with mobile terminals in trucks 20 via a communications satellite 18 in a geosynchronous orbit. Typically, the user applications, which could be web browser based, send text messages that are passed to the packet processing and network operations center 12, where they are processed and pass to channel units 14. These prepare a phase modulated intermediate frequency signal 15 that is passed to earthstation 16 for transmission over RF link to the satellite 18 for relay back to the mobile terminals in the trucks 20.

The mobile terminals in the trucks 20 also receive positioning signals from GPS satellites 21. This information is transmitted by to the earthstation 16 to permit the user to know the whereabouts of the trucks 20.

The data is encapsulated in packets that are transmitted using a time division multiple access (TDMA) protocol. At the receiver, the transmitted signal must be demodulated and decoded to extract the original data.

Figure 2:
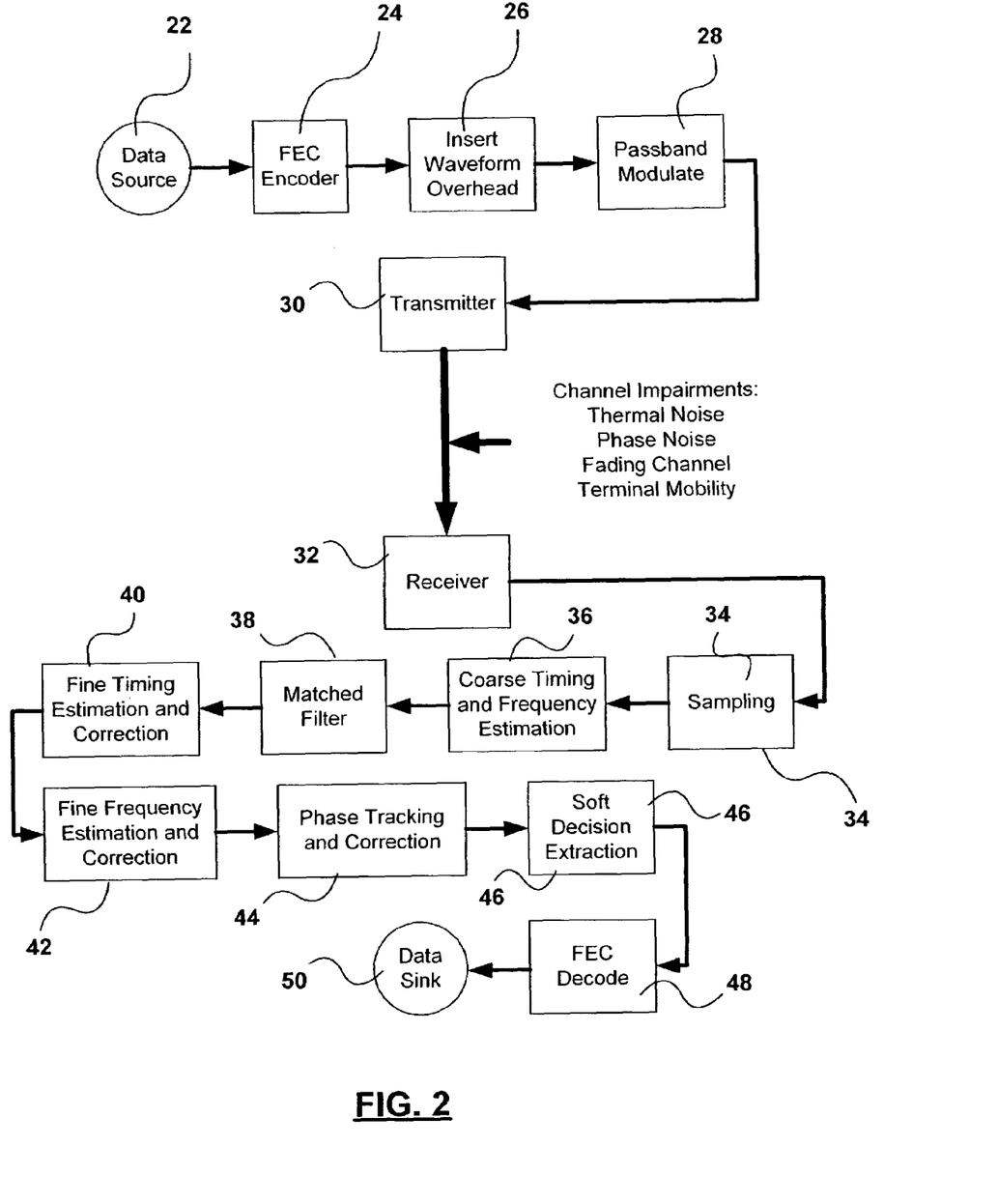
FIG. 2 is a block diagram of a one possible exemplary implementation of passband digital communications system.

FIG. 2 is a more detailed block diagram showing the relevant details of a typical communication system from data source 22 to data sink 50. Further details of such a system are described in the references referred to above. Many other techniques are possible as will be appreciated by one skilled in the art.

The original data from the data source 22 is passed to the FEC encoder 24, for example, a turbo encoder. The encoded data is then sent to unit 26 for insertion of the waveform overhead. This unit removes certain phase ambiguities present in the received signal. After passband modulation in unit 28, the signal is transmitted up to the satellite by transmitter 30.

The transmitted signal is received at the mobile terminals by the receiver 32 subject to channel impairments including thermal noise, phase noise, channel fading, and fluctuations caused by channel mobility. The received signal is passed to sampling unit 34 to obtain a digitized version of the received signal, typically after downconversion. The sampled signal is then sequentially passed to a coarse timing and frequency estimation unit 36, a matched filter 38, a fine timing estimation and correction unit 40, and fine frequency estimation and correction unit 42, a phase tracking and correction unit 44, a soft decision extraction unit 46, and an FEC decoder unit 48.

Figure 3:
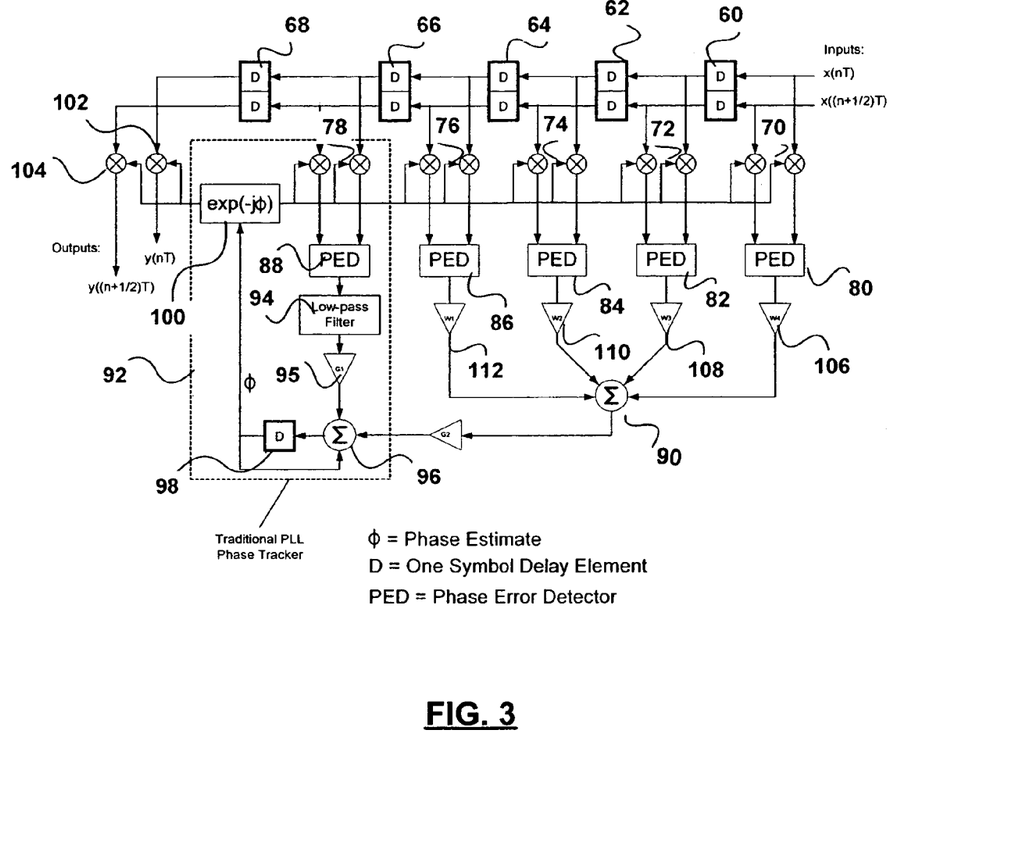
FIG. 3 is a more detailed block diagram of a phase tracker in accordance with one embodiment of the invention.

The invention is concerned with the phase tracking and correction unit 44, which is shown in more detail in FIG. 3. This figure shows a phase tracker for OQPSK (Offset Quadrature Phase Modulation), although it will be understood that other forms of phase modulation can be employed in the invention, or indeed other forms of linear modulation. The phase tracker filters out low frequency phase fluctuations due to thermal noise, movement of the mobile terminal etc., and permits the data to be recovered from the carrier waveform.

Figure 5:
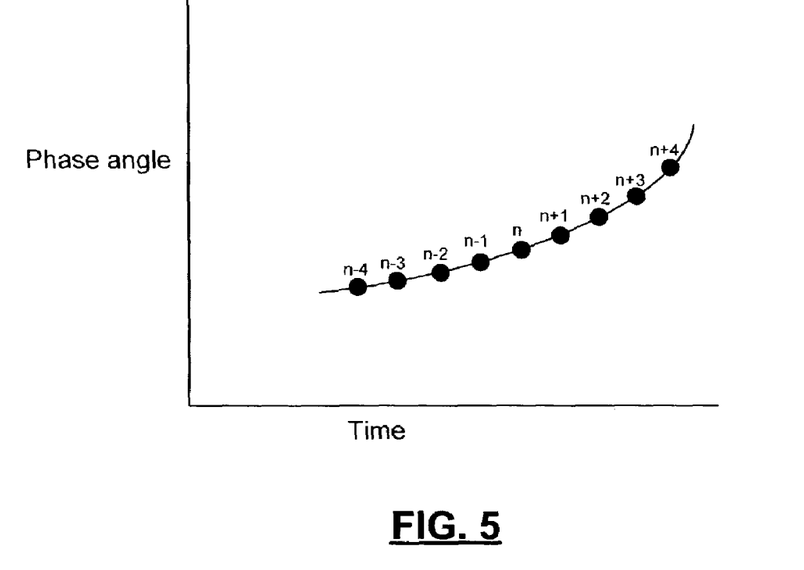
FIG. 5 is an arbitrary plot of phase against time.

The principle of operation of the novel phase tracker will be better understood by reference to FIG. 5. A traditional phase tracking loop estimates the phase of a sample at instant n from a series of past samples n−1, n−2, n−3 etc. The phase tracker can be initially seeded with an estimated value, or just set to an arbitrary initial value and allowed to gradually come into phase lock. The phase error is then measured and the iteration repeated along the curve representing phase. In traditional phase tracker the current symbol n is located at the extremity of the segment under consideration. In accordance with the principles of the invention, the phase estimate also takes into account "future" phase estimates at samples n+1, n+2, n+3 etc. This gives a much better phase estimate since the "current" sample is actually located at the median sample in the segment of interest rather than at one extremity. Averaging can thus be performed on both sides of the sample of interest. Of course, as noted above, the system cannot really look into the future, but an equivalent effect is achieved by storing a series of samples in a delay line and processing a sample several samples behind the sample currently being input.

The invention also permits an increase in the number of samples being used to compute a phase estimate without increasing the lag that occurs when the number of past samples used to compute the phase estimate is increased.

In addition, recomputation of the phase error on every iteration for all future samples minimizes the phase error, which improves signal-to-noise ratio performance.

The processing is performed on a packet-by-packet basis. Tracking is applied independently to the first and second halves of the packet. The first half actions are time-reversed with respect to the second half.

Referring to FIG. 3, a series of delay units 60, 62, 64, 66, 68 receive inputs x(nT), x((n+½T) corresponding to the I and Q components of the received signal, where T is the symbol period and n is an integer. The outputs of the delay units 60, 62, 64, 66 are passed to respective inputs of respective pairs of complex multipliers 70, 72, 74, 76, and 78 whose outputs are input to phase error detectors 80, 82, 84, 86, and 88.

The outputs of the phase error detectors 80, 82, 84, and 86 are weighted by weights W1 . . . W4 with the aid amplifiers 106, 108, 110, 112, summed in adder 90 and passed to a traditional phase-locked loop phase tracker 92, which is described in more detail in the references referred to above, after passing through gain adjusting amplifier 108, which adjusts the gain by a factor G2.

The phase locked loop phase tracker 92 comprises the phase error detector 88, low-pass filter 94, gain adjuster 95, summer 96, one-symbol delay element 98, and phase corrector 100.

The output of the phase corrector 100 provides the second inputs to multiplier pairs 78, 76, 74, 72, and 70, and also to multipliers 102, 104 that provide output signals y(nT) and y(n+½T) representing the data. The multipliers 102, 104 multiply the input signals delayed by one symbol by the complex representation of the inverse current phase to effectively remove the carrier from the input signals and thereby output the data.

The output of delay element 98 represents the phase estimate of the current symbol. This is a real value. The phase corrector 100 converts this to a complex quantity having real and imaginary components for input to complex multipliers 70, 72, 74, 76, 78 and representing the inverse phase of the output of delay element 98. The complex multipliers multiply the actual signals by the phase estimates for input to the phase error detectors 80, 82, 84, 86, which generate the phase error estimates for the next N future symbols (4 in this embodiment).

The output of the delay element 98 is added to the output of the gain adjusting amplifier 95 so that the phase error output by the amplifier 95 is converted to an actual phase estimate at the output of the delay element 98. For example, at any point in time, if the estimated phase taken from the previous sample was a number p and the phase error detected for the current sample is +r, the new phase estimate output by the adder 96 will be p+r since the error must be added (or subtracted) from the previous phase estimate to get the new phase estimate.

The input and output sequences x and y are indexed by the symbol index n. The timing of the signal is recovered prior to the phase tracker and the signal is converted to a complex baseband representation at two complex signed zero-mean samples per symbol by conventional means known to persons skilled in the art.

Timing estimation and correction is assumed to have operated on the received waveform such that the samples at time t=nT (where T is the symbol period) are time-aligned with the received in-phase bit stream, while the samples at t=(n+½)T are time-aligned with the received quadrature bit stream, which is delayed by half a symbol. The output sequence is a set of time-delayed, phase-corrected complex waveform samples from which soft bit decisions can be extracted directly. The phase estimate 100 is calculated on a per-symbol basis. Because the phase estimate is delayed by one symbol, the output sequence y is generated by applying the phase correction to the sample sequence delayed by one more symbol, to provide correct time alignment.

A number of different phase error detectors can used in the OQPSK tracker. A good choice for low signal-to-noise operation is the maximum likelihood phase detector. The output of this phase detector is calculated with the following equation:

$$e(nT) = \text{re}(z((n)T))\text{im}(z((n)T)) - \text{re}\left(z\left(\left(n+\frac{1}{2}\right)T\right)\right)\text{im}\left(z\left(\left(n+\frac{1}{2}\right)T\right)\right)$$

Alternatively, for example, a Decision-Directed phase error detector could be employed.

In this equation, the sequence z is the input to a particular phase error detector. It is a sampled OQPSK waveform of the same form and time alignment as x and y in FIG. 3 (two complex baseband samples per symbol). The sequence e(nT) is the phase error, calculated once per symbol.

The choice of gain constants G1 and G2, number of weights N and weights $w_k$, k=1 . . . N depends on the particular application. A natural choice of the weight coefficients is given by the impulse response of the low-pass filter incorporated into the traditional PLL phase tracker portion of the invention. For example, if the impulse response of the low-pass filter was [1, 0.9, .08,0.5,0.2,0,0, 0. . . ] the weights N=4 might be selected as 0.9, 0.8, 0.5, 0.2. In this manner, with equal gain constants G1 and G2 the combination of the low-pass filter and the forward-looking weighted sum provides a pseudo-smoothing operation on the phase errors which is centred on the symbol currently being processed. It is not a true smoothing operation because the forward-looking set of phase errors which are used in the weighted sum are recalculated every symbol.

Figure 4:
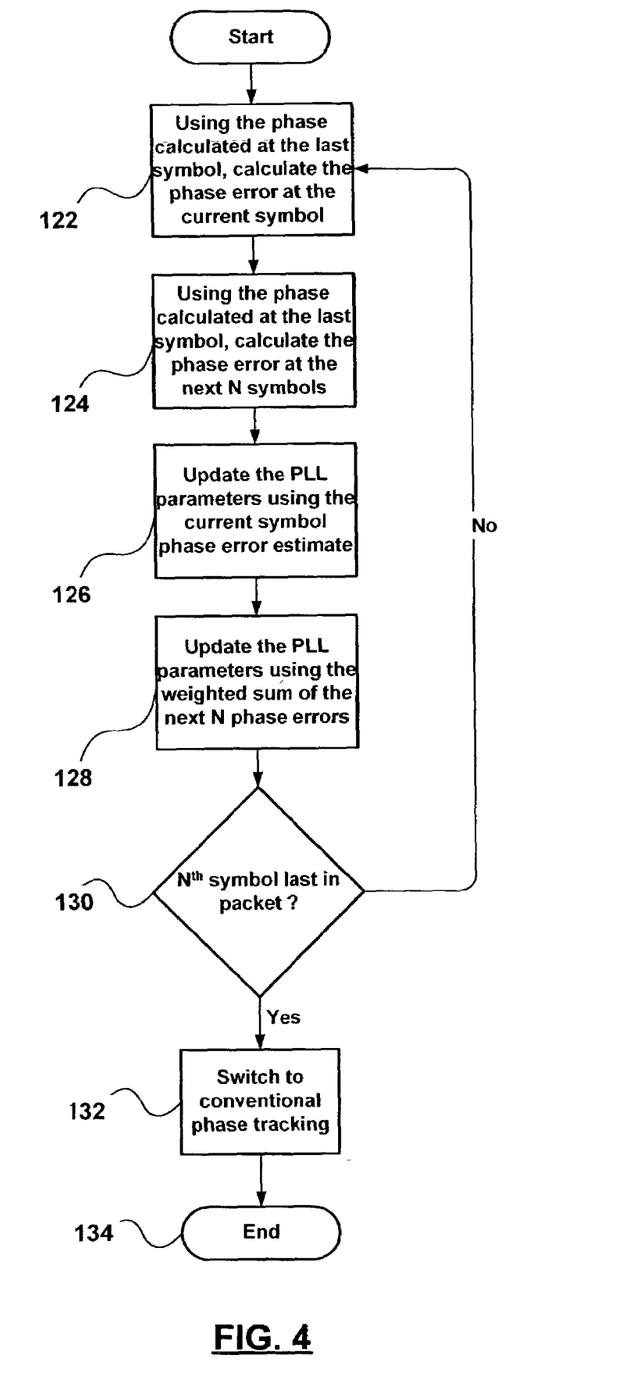
FIG. 4 is a flow chart illustrating the operation of the phase tracker.

The received symbols are shifted through the delay line comprising,units 60, 62, 64, 66, 68. The "current" symbol is stored in delay unit 68. This is actually not the symbol being currently input since processing takes place after a 4-symbol delay in order for the phase estimate to take into account the phase estimates of "future" symbols. As shown in FIG. 4, at step 122 the phase of the current symbol n in the delay unit 68 is estimated in the phase error detector 88 of phase locked loop 92 using the calculated phase estimate of the last symbol n−1. At step 124, this calculated phase error is used to update the output of low-pass filter 94 which is then multiplied by gain constant G1.

It will be appreciated that a transmission burst can be stored in memory, and the samples sequentially read out from memory at times correlated with the symbols. The processing does not necessarily have to take place in real time.

Next, at step 126, the phase error detectors 80, 82, 84, 86 estimate the phase errors of the next N symbols, n+1 . . . n+N, using the phase calculated for the last symbol n−1. These outputs are then multiplies by weight constants W, . . . W4, summed in adder 90, and passed through amplifier 108 to be multiplied by gain constant G2. The output of amplifier 108 is then added to the output of the low-pass filter 94 after gain adjustment and the output of delay unit 98 at step 128.

At the next step 130, a decision is made is to whether the Nth symbol is the last symbol in the packet. If so, the system switches to convention processing and sets the filter weights W1 to W4 to zero. If not, the processing continues. The system terminates at step 134 when all the symbols in the packet have been processed.

When the last N symbols in the packet have been reached, the tracking switches to the conventional mode. The same filter is used with the initial state vector unchanged. This is equivalent to setting the weights for the N future estimates to zero.

The output sequence y is generated by applying the phase correction in unit 100 to the sample sequence delayed by one more symbols to provide correct time alignment.

The benefit which can be achieved with the described phase tracking method was determined for simulated burst packet transmissions in a specific application. The transmitted packets were 450 symbols long, modulated as 900 symbol per second OQPSK. Root-raised-cosine pulse shaping with an excess bandwidth of 1.0 was used. The packet included a 40-symbol unique word sequence which was fixed and known at both the transmitter and receiver. The unique word is included for coarse time and frequency recovery as well as estimation of an initial phase for the phase tracker.

The packets were transmitted through a simulated impaired channel. The applied channel impairments on each packet were:
  Rician fading with a fading bandwidth of 90 Hz and a carrier-to-multipath ratio of 13 dB
  a normally distributed random initial phase error with a standard deviation of 0.17 radians. This was intended to model initial phase estimation errors.
  a normally distributed random initial frequency error with a standard deviation of 0.6 Hz. This was intended to model the residual error after frequency estimation and correction.
  a normally distributed random initial frequency rate of change with a standard deviation of 5.27 Hz/second. This was intended to model the effects of vehicle dynamics in this application.
  thermal noise, quantified as the symbol energy to noise power density ratio ($E_s/N_0$)
  The simulated performance was determined over a range of $E_s/N_0$ from −4 to +4 dB.

Forty thousand packets per Es/N0 value and per phase tracking technique were simulated. The results were determined as the fraction of packets in which one or more phase slips occurred. The phase slips were detected as a phase error greater than π/2 radians sustained for at least 40 symbols. Phase slip detection was performed using the imposed phase impairments due to initial phase and frequency errors and frequency drift, which were known quantities in a simulation environment.

The performance was assessed with two phase trackers: a traditional phase tracker and the improved phase tracker. In the traditional phase tracker, the gain G1 (see FIG. 2) was set to 0.23. The low-pass filter was implemented as a 36-tap finite impulse response filter with each tap weight set to 1/36, which gave a DC filter gain of 0 dB. In the improved phase tracker, the gains G1 and G2 (see FIG. 3) were both set to 0.23. The low-pass filter was implemented as a 36-tap finite impulse response filter with each tap weight set to 1/71. The number of forward-looking phase error detector branches N was 35. The summation weights W1 . . . W35 (see FIG. 2) were set to 1/71. With low-pass filter tap weights and the summation weights all set to 1/71 and with gain coefficients G1 and G2, the net effect of the weighted sum and the low-pass filter was a pseudo-smoothing operation with a gain of 0 dB.

Figure 6:
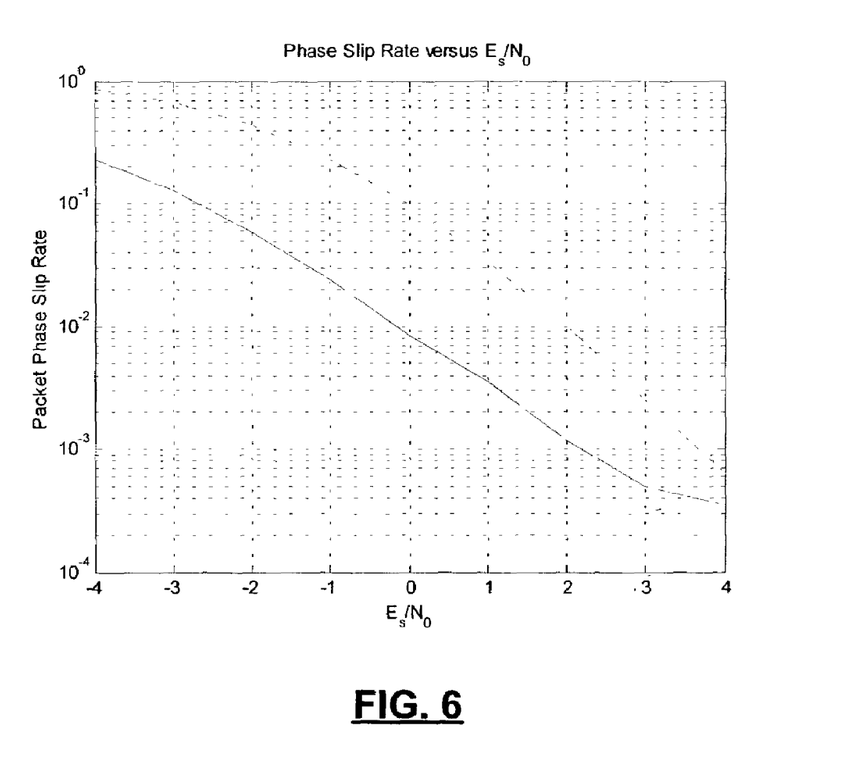
FIG. 6 is a plot showing the improvement in performance of a phase tracker in accordance with the invention.

The performance is shown in FIG. 6. It is plotted versus $E_s/N_0$ in dB. The upper plot shows packet phase slip rate with the traditional phase tracker, while the lower plot shows the packet phase slip rate with the improved phase tracker. It should be noted that a further improvement in phase slip rate might be achievable, as the improved phase tracker enables an increase in the effective loop gain (G1 and G2) while maintaining constant phase jitter.

It will be appreciated by persons skilled in the art that the functions described by the blocks illustrated in the drawings can be most conveniently implemented in a digital signal processor.

It will be understood by persons skilled in the art that numerous modifications may be made to the above example without departing from the scope and spirit of the appended claims.

I claim:

1. A method of tracking the phase of a received linearly-modulated carrier carrying a sequence of symbols, comprising:
   storing an input sequence of samples in a delay line;
   detecting the phase error of a current sample in a phase locked loop; and
   updating the phase error detected in said phase locked loop to take into account detected phase errors of future samples relative to said current sample.

2. A method as claimed in claim 1, wherein said detected phase error is updated to take into account the detected phase error of a sequence of the next N samples, where N is an integer.

3. A method as claimed in claim 2, wherein said detected phase error of said current sample is based on a phase estimate of a sample preceding said current sample.

4. A method as claimed in claim 3, wherein said detected phase errors of the next N samples are based on said phase estimate of the sample preceding said current sample.

5. A method as claimed in claim 2, wherein the phases error detected in said phase locked loop is updated by a weighted sum of said detected phase errors of said next N samples.

6. A method as claimed in claim 5, wherein the output of a low pass filter in said phase locked loop is updated by said weighted sum in an adder having first and second inputs receiving respectively the output of the low pass filter and the weighted sum of said detected phase errors.

7. A method as claimed in claim 6, wherein the output of said adder is delayed by one sample and added to a third input of said adder to generate a phase estimate for the current sample from said detected phase errors.

8. A method as claimed in claim 6, wherein weights for said respective phase errors of said next N samples are selected to perform a pseudo-smoothing operation on said phase errors, which is centered on the current sample.

9. A method as claimed in claim 8, wherein the weights for said respective phase errors of said next N samples correspond to the impulse response of said low pass filter.

10. A method as claimed as in claim 8, wherein said weights are set to zero when the $N^{th}$ sample is the last sample in a received packet.

11. A method as claimed in claim 8, wherein the gains of said weighted sum of the output of said phase error estimates and said low pass filter are adjusted to assist in said pseudo-smoothing operation.

12. A method as claimed in claim 1, wherein an output sequence is generated by applying a phase correction to said input sequence based on a phase estimate determined from said phase error delayed by a predetermined amount to provide correct timing alignment.

13. A method as claimed in claim 12, wherein said predetermined amount is one sample.

14. A method as claimed in claim 1, wherein said carrier is modulated by Offset Quadrature Phase Modulation.

15. An apparatus for tracking the phase of a received linearly-modulated carrier carrying a sequence of symbols, comprising:
   a delay line having a plurality of delay elements for storing an input sequence of samples;
   a phase locked loop including a phase error detector for detecting the phase error of a current sample;
   an arrangement of additional phase error detectors for detecting the phase errors of the next N samples relative to said current sample; and
   an updater for updating the phase error detected in said phase locked loop to take into account detected phase errors of said next N samples.

16. An apparatus as claimed in claim 15, wherein said additional phase error detectors detect the phase errors of the next N samples from a phase estimate of a sample preceding said current sample.

17. An apparatus as claimed in claim 16, further comprising a first adder for summing the outputs of said additional phase error detectors.

18. An apparatus as claimed in claim 17, further comprising an amplifier at the output of each of said plurality of phase error detectors for weighting the output of each of said plurality of phase error detectors.

19. An apparatus as claimed in claim 18, wherein said phase locked loop comprises a low pass filter connected to the output of said phase error detector in said phase locked loop, and said updater comprises a second adder having one input connected to the output of said low pass filter and another input connected to the output of said first adder.

20. An apparatus as claimed in claim 19, wherein said phase locked loop includes a delay element having an input connected to the output of said second adder and an output producing said phase estimate of the preceding sample.

21. An apparatus as claimed in claim 20, wherein the output of said delay element is also connected to a third input of said second adder.

22. An apparatus as claimed in claim 21, wherein the output of said delay element is also connected to the input of a complex representation generating element which generates a complex representation of said phase estimate of the preceding sample.

23. An apparatus as claimed in claim 22, wherein said complex representation generating element generates an inverse complex representation of said phase estimate of the preceding sample.

24. An apparatus as claimed in claim 23, wherein the output of said complex representation generating element is connected to first inputs of complex multipliers having second inputs receiving signals from said delay line and providing inputs to said additional phase error detectors.

25. An apparatus as claimed in claim 24, wherein the output of said complex representation generating element is also connected to first inputs of complex multipliers having second inputs receiving signals from said delay line and providing inputs to said phase error detector of said phase locked loop.

26. An apparatus as claimed in claim 25, wherein the output of said complex representation generating element is also connected to first inputs of complex multipliers having second inputs receiving signals from said delay and providing data outputs.

27. An apparatus as claimed in claim 21, further comprising a first amplifier connected to the output of said low-pass filter for adjusting the gain thereof by a constant factor.

28. An apparatus as claimed in claim 27, further comprising a second amplifier connected to the output of said first adder for adjusting the gain thereof by a constant factor.

29. An apparatus as claimed in claim 15, wherein said phase error detector and said additional phase error detectors are maximum likelihood detectors.

30. An apparatus as claimed in claim 15, wherein said linear modulation is OQPSK and said phase error detector and said additional phase error detectors determine their output on the basis of the following equation:

$$e(nT) = \text{re}(z((n)T))\text{im}(z((n)T)) - \text{re}\left(z\left(\left(n+\frac{1}{2}\right)T\right)\right)\text{im}\left(z\left(\left(n+\frac{1}{2}\right)T\right)\right)$$

where the sequence z is the input to a particular phase error detector the sequence e(nT) is the phase error, calculated once per sample.

31. An apparatus as claimed in claim 30, wherein said delay line has a pair of inputs for receiving respectively input sequences x(nT) and x((n−½)T) corresponding to I and Q components of said modulated *carrier*, and the delay elements of said delay line are arranged in pairs for said respective input *sequences*.

32. An apparatus as claimed in claim 31, wherein said phase error detector and said additional phase error detectors have first and second inputs receiving signals from said respective input sequences.

33. An apparatus as claimed in claim 32, wherein said first and second inputs are connected to respective multipliers receiving respectively at first and second inputs thereof signals from said first and second input sequences and phase estimate signals from said phase locked loop.

* * * * *